(12) United States Patent
Happ

(10) Patent No.: US 7,319,235 B2
(45) Date of Patent: Jan. 15, 2008

(54) RESISTIVE SEMICONDUCTOR ELEMENT BASED ON A SOLID-STATE ION CONDUCTOR

(75) Inventor: Thomas Happ, Pleasantville, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/159,404

(22) Filed: Jun. 23, 2005

(65) Prior Publication Data
US 2005/0285095 A1 Dec. 29, 2005

(30) Foreign Application Priority Data
Jun. 28, 2004 (DE) .................... 10 2004 031 135

(51) Int. Cl.
*G11C 13/02* (2006.01)
(52) U.S. Cl. .................. 257/2; 257/E45.004; 348/148
(58) Field of Classification Search ............... 257/2–5, 257/E27.004, E45.002; 365/148, 153, 163
See application file for complete search history.

(56) References Cited

U.S. PATENT DOCUMENTS 6,037,612 A * 3/2000 Nishimura et al. ......... 257/103
2002/0163030 A1 * 11/2002 Mandell et al. ............ 257/314
2003/0053350 A1 * 3/2003 Krieger et al. ............. 365/200
2003/0209971 A1 * 11/2003 Kozicki .................... 313/498
2004/0026729 A9 * 2/2004 Krieger et al. ............. 257/306

FOREIGN PATENT DOCUMENTS

EP         0 687 004 B1       12/2002
WO      WO 03/079463 A2        9/2003

OTHER PUBLICATIONS

Qingyuan Han, et al., "Ultra Low-k Porous Silicon Dioxide Films from a Plasma Process," IEEE, pp. 171-173.
Thieu Jacobs, et al., "Voiding in Ultra Porous Low-k Materials Proposed Mechanism, Detection and Possible Solutions," IEEE, pp. 236-238.

* cited by examiner

*Primary Examiner*—Thomas L. Dickey
(74) *Attorney, Agent, or Firm*—Edell, Shapiro & Finnan, LLC

(57) ABSTRACT

A nonvolatile, resistively switching memory cell has a layer of a porous dielectric between a first electrode. The dielectric is not a chalcogenide.

13 Claims, 1 Drawing Sheet

RESISTIVE SEMICONDUCTOR ELEMENT BASED ON A SOLID-STATE ION CONDUCTOR

CROSS REFERENCE TO RELATED APPLICATION

This application claims priority under 35 U.S.C. §119 to German Application No. DE 10 2004 031 135.8, filed on Jun. 28, 2004, and titled "Resistive Semiconductor Element Based on a Solid-State Ion Conductor," the entire contents of which are hereby incorporated by reference.

FIELD OF THE INVENTION

The present invention relates to the field of nonvolatile memories, and in particular, to a semiconductor element with solid-state ion conductor memory cells and a method for fabricating it the same.

BACKGROUND

A resistively operating nonvolatile memory cell has at least two different electrical resistances, which can be assigned, for example, to the "0" and "1" states. The memory cell may have a higher or lower electrical resistance as a function of the voltage applied and can be switched between these two resistances.

One of the main aims in the development of modem memory technologies is to increase the integration density, which means reducing the feature size of the memory cells on which the memory devices are based.

The technologies used, such as, for example, DRAM, SRAM, or flash memories, have drawbacks, such as, for example, volatility (DRAM), size (SRAM), or low endurance (number of possible read/write cycles). Hitherto, no technology has been able to satisfy these requirements for different applications.

Ionic solid-state memories are a promising technology for nonvolatile memory cells. These materials may be solid-state electrolytes in either amorphous or polycrystalline form with a grain size in the nanometer range.

For example, certain metals, such as, for example, silver or copper, can be dissolved in chalcogenide glasses. The term "glass" in the broader sense is to be understood in very general terms as meaning a melt that has been supercooled in amorphous form and the atoms of which do not have a continuous long-range order, but rather only a locally limited crystalline arrangement (short-range order) in a three-dimensional, unordered network.

Glasses may be both electrical insulators and electrical semiconductors, depending on which ions are present in the glass and whether the ions which are present are mobile or bonded. The conductivity of the silicon glasses can be obtained, for example, by incorporating ions, such as, for example, sodium, lithium, or silver ions in the glass. If metal ions are dissolved in the glass, the system can be regarded as a "solid-state electrolyte" and the glass alone as a "solid-state ion conductor."

Chalcogenide glasses can be produced based on compounds of the general formula $M_mX_n$, where M is one or more metals from the group consisting of Ge, Sb, Bi, and As, and X is one or more elements selected from the group consisting of S, Se, and Te. The indices m and n do not have to be integer numbers, since metals can adopt a number of oxidation states which are present simultaneously.

The chalcogenide glasses are generally semiconducting. Dissolving the metal ions in the chalcogenide glasses produces a solid solution of the relevant ions in the glass. Silver ions can be dissolved, for example, by deposition of an Ag film on a chalcogenide glass and subsequent irradiation. The irradiation of a sufficiently thick film of Ag on $Ge_3Se_7$ produces, for example, a material of formula $Ag_{0.33}Ge_{0.20}Se_{0.47}$. Accordingly, the solutions can be formed by the photo-dissolution of silver in, for example, $As_2S_3$, $AsS_2$, $GeSe_2$.

An approach for fabrication of resistive nonvolatile memory cells is based on the use of the solid solutions in chalcogenide glasses as active (switching) material for non-volatile memory cells. A memory cell of this type has a layer of a chalcogenide glass, in which metal ions of the material from which one of the electrodes is formed are dissolved, arranged between a first electrode and a second electrode.

Chalcogenide glass memory cells are based on an electrochemical redox process, in which metal ions of one electrode are able to reversibly diffuse in and out of the solid-state electrolyte material and thereby to form and remove a low-resistance path. More specifically, the material of chalcogenide glasses is arranged between two electrodes. One electrode is an inert electrode and the other electrode is a reactive electrode.

The ions of the reactive electrode are soluble in the chalcogenide glass.

Hirose et al., Journal of Applied Physics, Vol. 47, No. 6, 1976, pp. 2767 to 2772, "Polarity-dependent memory switching and behavior of Ag dendrite in Ag-photodoped amorphous $As_2S_3$ films," describe an arrangement with an inert electrode of molybdenum or gold, a second electrode of silver, and a layer of a chalcogenide glass of $As_2S_3$ photodoped with $Ag^+$ ions arranged between the two electrodes. Application of a positive voltage, which is above the minimum threshold voltage, to the Ag electrode oxidizes the electrode, causes the $Ag^+$ ions to be driven into the chalcogenide glass and reduced again at the inert electrode, which leads to metallic deposits in the form of a conductive Ag path (dendrites) between the first electrode and the second electrode. This lowers the electrical resistance of the arrangement. In this state, the electrical resistance of the solid-state electrolyte is reduced significantly, for example, by several orders of magnitude, compared to the state without a metallic current path, thereby defining the ON state of the memory cell. If a voltage of the opposite polarity is applied to the two electrodes, the metallic deposits and the current path are removed again. As a result, the two electrodes are no longer continuously electrically connected to one another, thereby defining the OFF state of the memory cell, since, in this state, the memory cell has a higher resistance than in the ON state.

Therefore, the general mechanism can be explained as the reactive electrode with the solid-state electrolyte forms a redox system in which a redox reaction takes place above a defined threshold voltage ($V_{th}$). The redox reaction can take place in one reaction direction or the other depending on the polarity of the voltage applied to the two electrodes, although this voltage must be higher than the threshold voltage. Depending on the voltage applied, the reactive electrode is oxidized and the metal ions of the reactive electrode diffuse into the chalcogenide glass and are reduced at the inert electrode. If metal ions are continuously released into the solid-state electrolyte, the number and size of the metallic deposits increase until ultimately a metallic current path which bridges the two electrodes is formed (ON state). If the polarity of the voltage is reversed, metal ions diffuse out of the chalcogenide glass and are reduced at the reactive electrode, which leads to the metallic deposits on the inert electrode being broken down. This process is continued, under the influence of the applied voltage, until the metallic deposits which form the electrical path are completely broken down (OFF state). The electrical resistance of the OFF state is two to six orders of magnitude greater than the resistance of the ON state.

An element based on the mechanism described above is also known as a programmable memorization cell (PMC). Another approach is doping the chalcogenide glass with metal atoms, resulting in the formation of conducting islands which, by percolative bridging in a random network, define the ON state.

Hitherto, there has not been either integrated demonstrators nor products for this memory technology. Implementation of individual switching elements based on chalcogenide glasses, such as $As_2S_3$, GeSe, or GeS, and $WO_x$, is known. M. N. Kozicki et al., "Superlattices and Microstructures," Vol. 27, No. 5/6, 2000, pp. 485 to 488, M. N. Kozicki et al., Electrochemical Society Proceedings, Vol. 99-13, 1999, pp. 298 to 309, "Applications of Programmable Resistance Changes in Metal-Doped Chalcogenides," and M. N. Kozicki et al., 2002, "Can Solid State Electrochemistry Eliminate the Memory Scaling Quandary?" The aforementioned publications propose depositing solid-state electrolyte in a via hole vertically etched in a conventional interdielectric (hole between two metallization levels of a semiconductor element). Then, the material of the reactive electrode is deposited and patterned, for example, by a suitable etching process or by chemical mechanical polishing (CMP). This is followed by a process which forces the material of the reactive electrode into the solid-state electrolyte, in order, through UV irradiation, to generate background doping of the solid-state electrolyte with the metal of the reactive electrode.

However, use of chalcogenide materials, as known, conceals drawbacks, such as the limited thermal stability of the chalcogenide glasses requiring special measures for the back-end integration of a fully integrated memory. For example, Se-rich, GeSe has a phase transition of just 212° C., which causes serious drawbacks, in particular, with a view to processing in the back-end region (Gokhale et al., Bull. Alloy Phase Diagrams 11 (3), 1990). The introduction of new materials based on chalcogenide glasses requires a high level of outlay and possibly additional tools in order to prevent contamination during CMOS fabrication. Moreover, some chalcogenide glasses are relatively toxic materials, which require additional precautions for safe operation during production.

Memory cell based on solid-state electrolytes without chalcogenide glasses, and a method for fabricating resistive nonvolatile memory cells, in which the cells are based on solid-state ion electrolytes without using the chalcogenide glasses, are desirable.

SUMMARY

The present invention uses nanoporous low-k dielectrics rather than chalcogenide glasses, as solid-state ion conductors in conductive bridge (CB) memory cells. A wide range of low-k dielectrics are known and can be deposited on the electrode by various deposition processes, such as CVD, PECVD, or spin-coating. Low-k dielectrics have a pore structure that allows mobility of the ions of the reactive electrode. The chemical properties and the pore structure vary in a relatively wide range. The known low-k dielectrics are often based on organosilicates and have a porosity in the range from 1 to 50% with a pore size in the range from 1 to 10 nm. The porosity is given as a percentage and is understood to be a ratio of the volume taken up by the pores to the total volume. The porosity is therefore dependent on the pore size and on the pore frequency.

Known representatives of porous materials deposited by CVD are carbon-doped silicon oxides, fluorinated silicates, and silsesquioxanes deposited by spin-on processes.

However, the present invention is not restricted to known low-k dielectrics, but rather encompasses dielectrics which have a certain pore size in order to allow the mobility of the ions. Examples of further representative dielectrics according to the invention include organic compounds and mechanical polymers.

Table 1 gives an overview of typical, commercially available low-k dielectrics.

TABLE 1

| Deposition by | Material | Manufacturer | k |
|---|---|---|---|
| CVD | Flowfill | Trikon | 2.5-4.0 |
| PECVD | Fluorinated silicate | AMAT Novellus | 3.4-3.8 |
| | Fluorinated silicate (HDP) | AMAT | 3.4-3.9 (3,3) |
| | Coral | Novellus | 2.5-3.4 |
| | AURORA | ASM | 2.5-2.7 |
| | Black diamond | AMAT | 2.6-3.0 |
| | ORION | Trikon | 1.9-2.8 |
| Spin On | XLK ([HSQ]) | Dow Corning | 2.9-3.4 |
| | LKD (silsesquioxane [MSQ]) | JSR | 2.4-2.7 |
| | Fox (silsesquioxane HSQ) | Dow Corning | 2.6-2.8 |
| | HOSP (silsesquioxane [MSQ]) | Honeywell | 2.6 |
| | SILK | Down Chemical | 2.1-2.7 |
| | Flare | Honeywell | 2.1-2.7 |
| | Velox | Schumacher | 2.1-2.7 |

The materials, Flowfill, Coral, AURORA, Black Diamond, and Orion, are C-doped silicon oxide. The materials, XLK, LKD, Fox, and HOSP, are silsesquioxanes, HSQ, or MSQ (hydrogen silsesquioxanes or methyl selsesquioxanes), and the materials, SILK, Flare, and Velox are organic, aromatic dielectrics.

The porosity is set within wide ranges by selecting the deposition conditions.

An overview in accordance with J. T. Rantala et al., "The case for nonporous low-k dielectrics," Solid State Technology, 12/03, 34, 2003 of the pore properties of typical low-k dielectrics is compiled in Table 2:

TABLE 2

| Material | porosity (%) | mean pore size (nm) |
|---|---|---|
| CVD FSG | <10 | 1 |
| CVD SiCH0 | 5-15 | 1 |
| dense MSQ (ZirkonTM) | 17 | 1-2.5 |
| porous MSQ | 35 | 3 |
| XLK | 50 | 4 |
| porous SiLK | 30 | 4 |

That ions diffuse through these dielectrics disadvantageously is described as disadvantageous in the prior art (cf. in this respect Fang et al., "Electrical and Material Stability of Orion® CVD Ultra Low-k Dielectric Film for Copper Interconnection," http://www.sea.rl.ac.uk/newsea/newpubs/action/electrical.pdf; Mallikarjunan et al.: Applied Physics Letters, Vol. 79, 2001, pp. 1855 to 1857, "Metal drift behavior in low dielectric organosiloxane polymer"; Fang et al., Journal of Applied Physics, Vol. 93, 2003, pp. 5546 to 5550, "Metal drift induced electrical instability of porous low dielectric constant film."

However, the present invention uses a property which has hitherto been regarded as disadvantageous. In particular, certain ions diffuse through low-k dielectrics to fabricate resistive nonvolatile memory cells.

In one exemplary embodiment, the dielectric according to the invention has a porosity in the range from 1-50%. Porosity is set just below the percolation threshold. The term "percolation threshold" is to be understood as meaning the structure transition between the structure of an open-cell foam and the structure of a closed-cell foam. Setting the pore density just below the percolation threshold, which is, for example, between 17 and 25%, results in relatively rapid, but incomplete in-diffusion of the metal ions. Specifically, the porosity gives a relatively high mobility for a relatively wide range of metal ions. In one embodiment, the dielectric of the memory cell according to the invention includes a PECVD-deposited SiCHO layer ("ORION®"), since this material enables aluminum and copper ions to be introduced into the dielectric relatively quickly and reversibly by electric fields. The pore size of the dielectric according to the invention is, for example, in the range from 1 to 10 nm.

The choice of inert electrodes is not critical, provided that the electrode does not participate in the redox process. Materials, for example, for forming the inert electrode include platinum (Pt), gold (Au), titanium (Ti), titanium nitride (TiN), tantalum (Ta), tantalum nitride (TaN), tungsten (W), titanium tungsten (TiW), tantalum tungsten (TaW), tungsten nitride (Wn), tungsten carbonitride (WCN), iridium (Ir), iridium oxide (IrO), ruthenium (Ru), strontium-ruthenium oxide (SrRuO), or any desired combination of these materials, including in two or more layers. Furthermore, in combination with the abovementioned layers or materials, thin films of silicon (Si), titanium nitride/silicon (TiNSi), silicon oxynitride (SiON), silicon oxide (SiO), silicon carbide (SiC), silicon nitride (SiN), or silicon carbonitride (SiCN) can be used. The choice of inert electrode is not restricted to the materials listed above, since the inert electrode only needs to not participate in the redox process. Therefore, the inert electrode may also be, for example, of graphite (C).

Any material that can be oxidized under the influence of the assumed voltage with the ions then diffusing into the porous dielectric is suitable for use as material for the reactive electrode. Examples include copper, aluminum, or silver.

Memory cells according to the invention have mechanical and thermal properties, making the selection of the porous low-k dielectrics superior to the chalcogenide glasses. For example, ORION® (Trikon) is stable at temperatures up to over 600° C. and withstands mechanical stress of more than 25 Mpa (cf. in this respect, Fang et al., "Metal drift induced electrical instability of porous low dielectric constant film," J. Appl. Phys 93 (9), 5546, 2003).

The memory cell according to the invention is patterned in a via opening formed in a dielectric between two metallization levels. Conventional materials, such as, for example, $SiO_2$, SiN, SiON, or the like, are suitable for use as the surrounding dielectric present between two metallization levels. Other nonporous low-k dielectric insulate the memory cell. The surrounding dielectric used is, for example, organic or inorganic low-k materials, if the metal ions of the reactive electrode do not diffuse through the inorganic low-k materials. If the low-k dielectrics, which allow diffusion of the metal ions of the reactive electrode, are used as surrounding dielectric, a diffusion barrier layer is arranged between the memory cell and the surrounding dielectric.

In the method according to the invention, a metallization level is deposited, and a layer of a surrounding dielectric is then applied to the metallization level. The first metallization level serves as one of the electrodes of the memory cell. The applied dielectric layer is then patterned, for example, by photolithographic methods, so that the metallization level is partially uncovered. A layer of a porous low-k dielectric is deposited on the uncovered sections of the metallization level in order for the layer of the second electrode for the memory cell to be deposited thereon and patterned. The first metallization level, which serves as an inert cathode, is formed, for example, from platinum, tantalum, tantalum nitride, titanium, titanium nitride, or carbon. The layer, which serves as a reactive cathode, is formed, for example, from silver, copper, aluminum, or zinc. A further metallization level for contact-connection of the storage electrode is deposited on the second metallization level.

BRIEF DESCRIPTION OF THE DRAWINGS

The invention is described in more detail with reference to the figure, in which.

DETAILED DESCRIPTION

Figure 1:
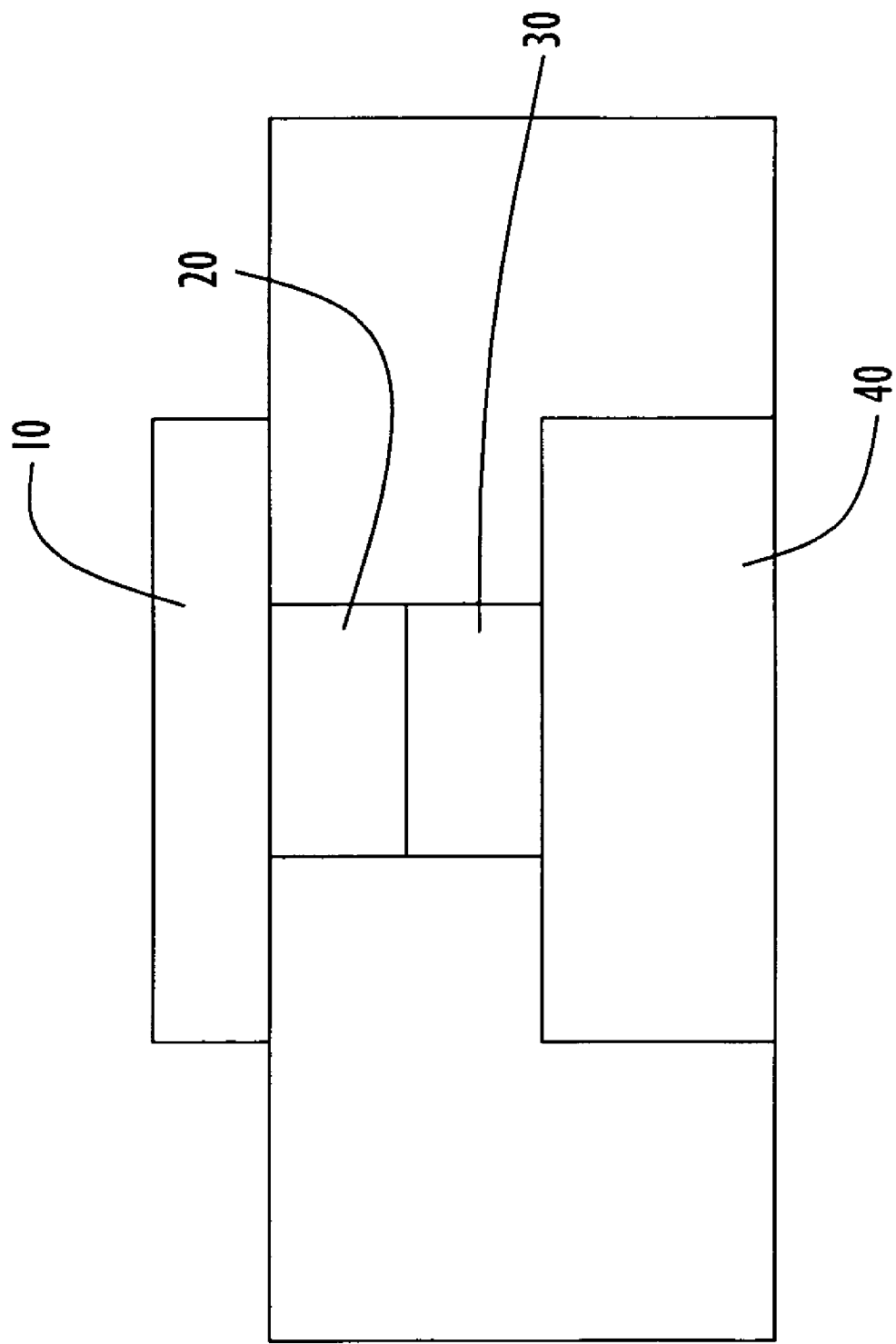
FIG. 1 shows a memory cell according to the invention with an inert cathode, a porous ion conductor, and a reactive anode.

FIG. 1 illustrates a memory cell according to an exemplary embodiment of the invention, including a porous ion conductor 30 between an inert cathode 40 and a reactive anode 20. A layer for contact-connection 10 or a further interconnect is deposited on the reactive anode. The processes of the memory cell of the present invention are compatible with CMOS technology so that a high integration density is possible.

The memory cell can be located between bit or word lines that cross one another "cross-point structure." The cell is fabricated by an interconnect 10, which serves as the first electrode or as the second electrode, deposited on a substrate, for example, with a contact. The deposition takes place, for example, from the vapor phase or from solution. Processes, such as, for example, PVD, CVD, PECVD, sputtering, electroplating, electroless plating, or atomic layer CVD (ALCVD), are suitable for this purpose. The substrate can be patterned by standard process techniques (i.e., application of a photoresist, exposure, developing, etc.). Then, the pattern is transferred to the lower layer by etching by a gas or a gas mixture or a plasma or by a liquid or liquid mixture. In addition to patterning by etching, however, the interconnect can be patterned by the Damascene technique. For example, an insulation layer (i.e., silicon oxide) located above the substrate is patterned by lithography and etching. After stripping of the photoresist, the layer is deposited, so that the trenches and holes formed in the insulation layer during patterning are completely filled with the electrode materials. Then, that part of the materials which forms the first interconnect and is above the surface of the insulation layer is ground back, for example, by CMP (chemical mechanical planarization). This produces, for example, interconnects and/or contact holes filled with electrode materials, embedded in the insulation layer, and are relatively the same height as the insulation layer.

Then, a layer of an insulating material is deposited on the interconnect 10. The holes filled with the porous ion conductor 30 are produced in this layer. The patterning and filling of the holes are known to the person skilled in the art, and standard photolithography techniques are used for this purpose. Then, a layer for the second electrode is deposited on the porous ion conductor 30. Then, further interconnect, which is, for example, at 90° with respect to the first interconnect, is deposited. By applying a further layer of the insulation layer and repeating the steps, the memory cells according to the invention are stacked in a number of layers on top of one another. If the material of the reactive electrode is not identical to the material of the interconnect, the porous low-k dielectric is partially etched back, then a layer of the material for the reactive layer is deposited, and then the material for the interconnect is deposited. Patterning of the cross-point memory cells is known in the art, and the techniques already developed for cross-point memory cells are used for the cells according to the invention.

Each memory cell according to the invention is connected to active elements, such as, for example, a diode or a transistor, in order to be driven in a controlled way.

The memory cell according to the invention has electrical properties, and is suitable for integration in existing processes. By avoiding chalcogenide materials, materials are no longer contaminated by elements of the chalcogenide glasses. Moreover, handling of toxic materials that form some chalcogenide glasses is no longer needed.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A nonvolatile, resistively switching memory cell, comprising:
   a layer of a solid-state ion conductor arranged between a first electrode and a second electrode, wherein the solid-state ion conductor includes a nanoporous low-k dielectric and is free of chalcogenide glass, wherein the porosity of the dielectric is in the range of 1 to 50%, and wherein the dielectric includes ions of a metal from which one of the electrodes is formed.

2. The nonvolatile, resistively switching memory cell as claimed in claim 1, wherein the dielectric is selected from the group consisting of: carbon-doped silicon dioxide, fluorinated silicate, silsesquioxane, and an aromatic organic dielectric.

3. The nonvolatile, resistively switching memory cell as claimed in claim 1, wherein the porosity of the porous low-k dielectric is below the percolation threshold.

4. The nonvolatile, resistively switching memory cell as claimed in claim 1, wherein the pore size of the porous dielectric is in the range from 1 to 10 nm.

5. The nonvolatile, resistively switching memory cell as claimed in claim 1, wherein the first electrode is selected from the group consisting of tantalum, copper, aluminum, and silver.

6. The nonvolatile, resistively switching memory cell as claimed in claim 1, wherein the second electrode is selected from the group consisting of gold, tungsten, titanium, titanium nitride, platinum, tantalum, tantalum nitride, carbon, W, TaW, WCN, WN, Ir,IrO, Ru, RuO, and SrRuO.

7. The nonvolatile, resistively switching memory cell as claimed in claim 1, wherein the layer of a solid-state ion conductor is directly adjacent the first and second electrodes.

8. A nonvolatile, resistively switching memory cell, comprising:
   an inert electrode;
   a reactive electrode; and
   a solid-state ion conductor layer arranged between the inert electrode and the reactive electrode, the solid-state ion conductor layer being switchable between a low-resistance state and a high-resistance state via application of suitable voltages to the reactive electrode that cause metal ions from the reactive electrode to reversibly diffuse into and out of the solid-state ion conductor layer, wherein the solid-state ion conductor layer comprises a nanoporous low-k dielectric and is free of chalcogenide glass and wherein the porosity of the nanoporous low-k dielectric is in the range of 1 to 50% and is below the percolation threshold.

9. The nonvolatile, resistively switching memory cell as claimed in claim 8, wherein the layer of a solid-state ion conductor is directly adjacent the first and second electrodes.

10. The nonvolatile, resistively switching memory cell as claimed in claim 8, wherein the nanoporous low-k dielectric comprises at least one of: carbon-doped silicon dioxide, fluorinated silicate, silsesquioxane, and an aromatic organic dielectric.

11. The nonvolatile, resistively switching memory cell as claimed in claim 8, wherein the pore size of the nanoporous low-k dielectric is in the range from 1 to 10 nm.

12. The nonvolatile, resistively switching memory cell as claimed in claim 8, wherein the reactive electrode comprises at least one of tantalum, copper, aluminum, and silver.

13. The nonvolatile, resistively switching memory cell as claimed in claim 8, wherein the inert electrode comprises at least one of gold, tungsten, titanium, titanium nitride, platinum, tantalum, tantalum nitride, carbon, W, TaW, WCN, WN, Ir, IrO, Ru, RuO, and SrRuO.

* * * * *

UNITED STATES PATENT AND TRADEMARK OFFICE
CERTIFICATE OF CORRECTION

PATENT NO. : 7,319,235 B2
APPLICATION NO. : 11/159404
DATED : January 15, 2008
INVENTOR(S) : Thomas Happ It is certified that error appears in the above-identified patent and that said Letters Patent is hereby corrected as shown below:

Column 1, line 29: Change "modem" to -- modern --

Signed and Sealed this

Thirteenth Day of May, 2008

JON W. DUDAS
*Director of the United States Patent and Trademark Office*